United States Patent [19]

Gioia

[11] Patent Number: 4,874,713
[45] Date of Patent: Oct. 17, 1989

[54] METHOD OF MAKING ASYMMETRICALLY OPTIMIZED CMOS FIELD EFFECT TRANSISTORS

[75] Inventor: Samuel C. Gioia, Colorado Springs, Colo.

[73] Assignee: NCR Corporation, Dayton, Ohio

[21] Appl. No.: 345,875

[22] Filed: May 1, 1989

[51] Int. Cl.$^4$ .......................................... H01L 21/265
[52] U.S. Cl. .......................................... 437/34; 437/41; 437/44; 437/56; 437/57; 437/200; 437/228
[58] Field of Search .................. 437/29, 34, 40, 41, 437/44, 57, 56, 200, 201, 228; 357/42

[56] References Cited

U.S. PATENT DOCUMENTS

| | | | |
|---|---|---|---|
| 3,686,080 | 7/1971 | Banfield et al. | 437/190 |
| 3,747,200 | 7/1973 | Rutledge | 437/40 |
| 3,887,993 | 6/1975 | Okada et al. | 437/41 |
| 4,267,012 | 5/1981 | Pierce et al. | 156/656 |
| 4,441,247 | 4/1984 | Gargini et al. | 437/59 |
| 4,503,601 | 3/1985 | Chiao | 437/40 |
| 4,546,540 | 10/1985 | Ueyanagi et al. | 148/DIG. 143 |
| 4,648,175 | 3/1987 | Metz, Jr. et al. | 437/200 |
| 4,703,551 | 11/1987 | Szluk et al. | 437/30 |
| 4,711,701 | 12/1987 | McLevige | 437/41 |
| 4,717,684 | 1/1988 | Kaho et al. | 437/57 |
| 4,722,909 | 2/1988 | Parrillo et al. | 437/34 |
| 4,830,971 | 5/1989 | Shibata | 437/29 |

Primary Examiner—Brian E. Hearn
Assistant Examiner—T. Thomas
Attorney, Agent, or Firm—Wilbert Hawk, Jr.; Casimer K. Salys

[57] ABSTRACT

A process for forming an asymmetrically structured pair of CMOS field effect transistors having feature refinements matched to the individual idiosyncrasies of the p-channel and n-channel transistors. Complementary transistors are formed using a single photolithographic mask and a fabrication sequence which begins with the p-channel transistor source/drain formation. Thereafter, the p-channel transistor source/drain regions are metalized, the n-channel transistor lightly doped drain regions are formed, and the sidewall dielectric spaced n-channel transistor source/drain regions are formed using the p-channel metalization as a mask. The p-channel transistor source/drain metalization suppresses the effects of the relatively greater p-type source/drain resistivity, while the LDD structure of the n-channel transistor reduces performance degradation attributable to hot electron trapping. The structural asymmetry attributable to the process materially offsets performance limitations common to the individual CMOS transistor types.

11 Claims, 6 Drawing Sheets

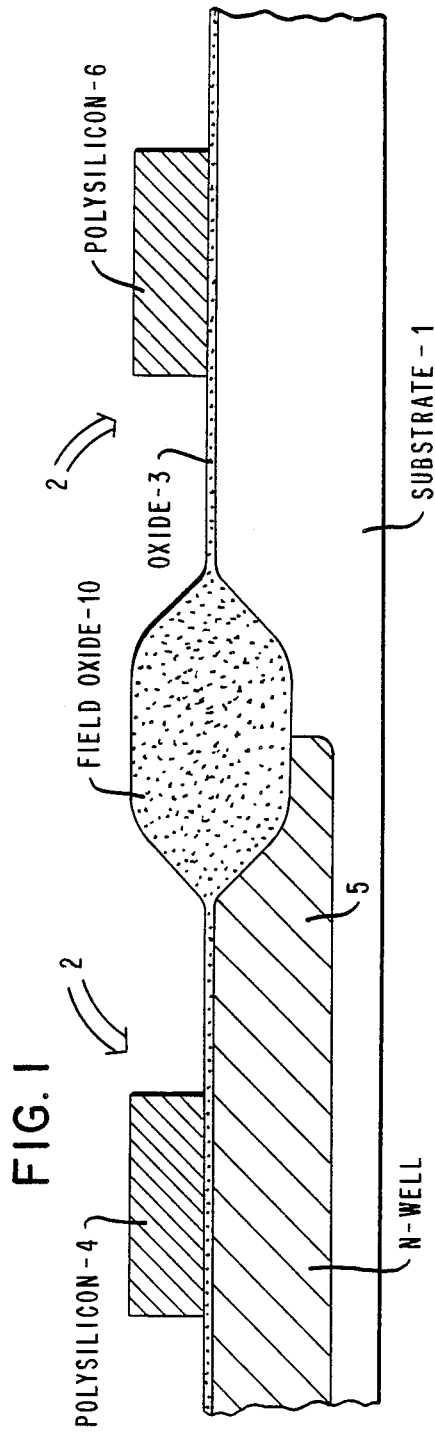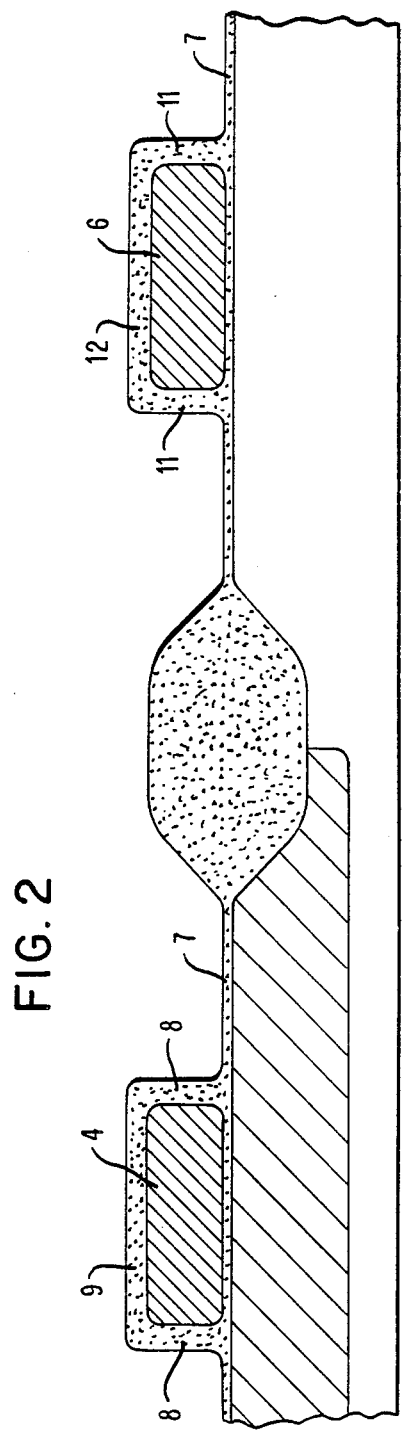

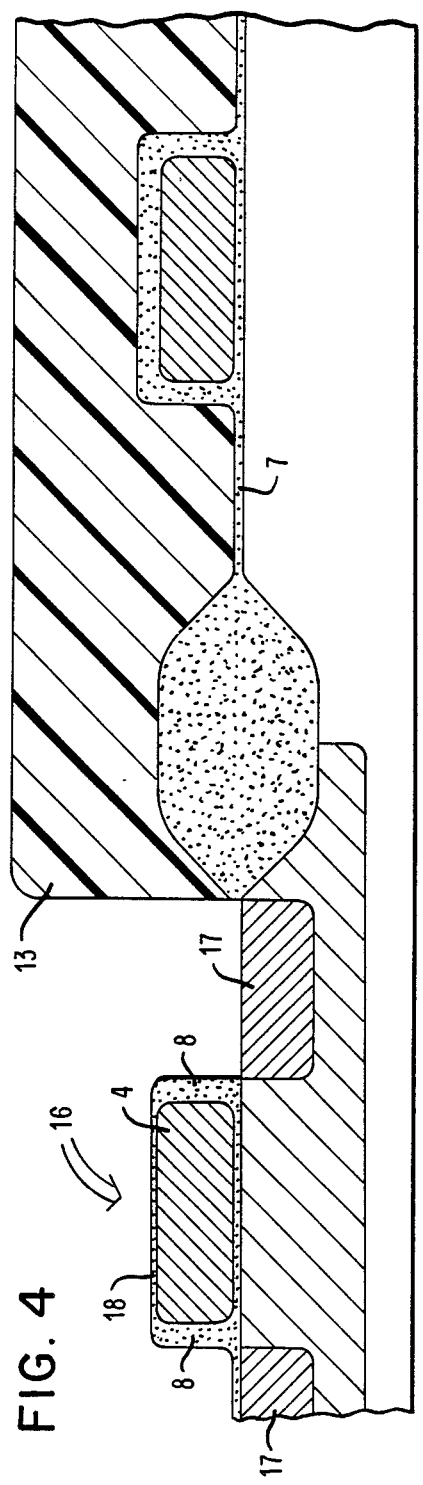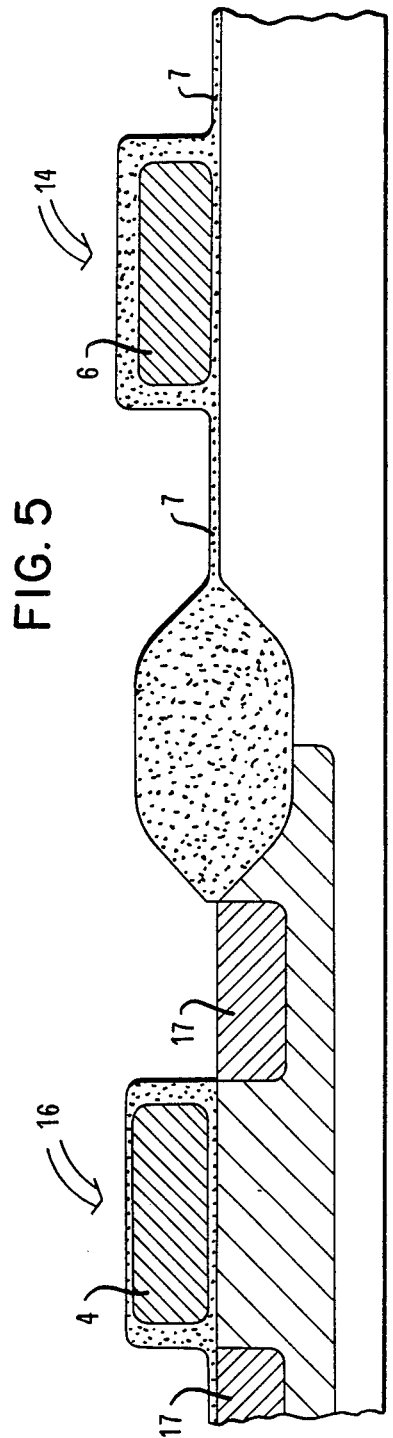

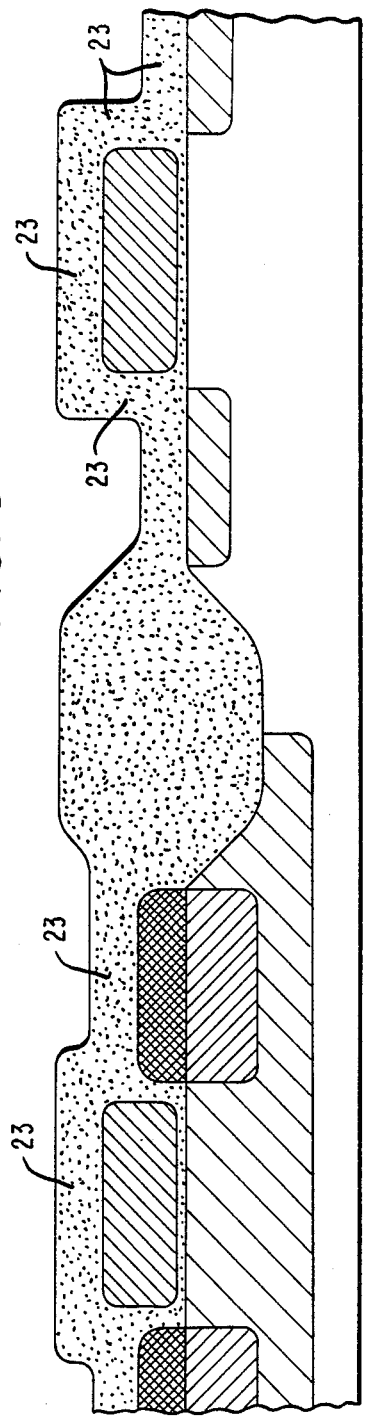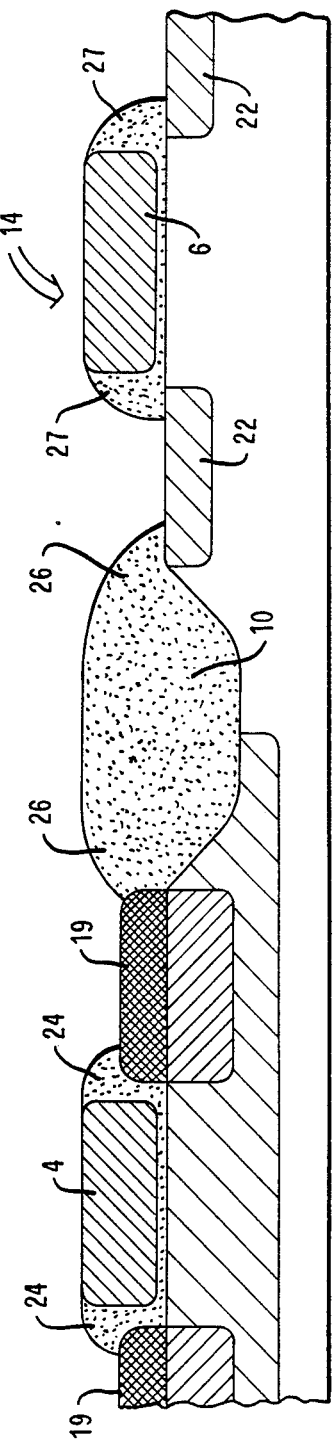

METHOD OF MAKING ASYMMETRICALLY OPTIMIZED CMOS FIELD EFFECT TRANSISTORS

BACKGROUND OF THE INVENTION

The present invention relates generally to a process for creating integrated circuit electronic devices. More particularly, the invention involves a process for forming refined CMOS class field effect transistor source/drain regions using a single photolithographic mask. The devices are formed to have metalized source/drain regions for p-channel field effect transistors and lightly doped drain (LDD) n-channel field effect transistor structures.

The use of selectively deposited tungsten to reduce the resistivity of source/drain regions is known to those who routinely practice in the art. Likewise, the configuration of n-channel field effect transistors with lightly doped drain (LDD) structures, which structures minimize transistor degradation due to hot electron trapping in the gate oxide layer, is known and selectively practiced. A representative discussion of the concepts and their application to the formation of field effect transistors appears in U.S. Pat. No. 4,503,601. The selective retention of metallic layers by forming silicides predates selective deposition of metal, and is known to generally involve a blanket deposition of the metal, a conditioning in a reactive environment to form silicides with exposed silicon, and a selective removal of metal which has not undergone reaction with exposed silicon. Those of skill in the art are also aware that sidewall dielectric layers may be created by anisotropic etching of a dielectric in the course of creating of lightly doped drain regions.

The prevailing practice of the prior art has been to create n-channel and p-channel transistors employing fabrication sequences which are relatively mirror images of each other, adjusted, for example, as to impurity concentration to offset the lower mobility of p-type regions and in structure to compensate for the relatively elevated susceptibility of n-channel transistors to the hot electron trapping phenomenon. Fundamental structural asymmetry between the two types of CMOS field effect transistors has not been ackowledged as a meaningful objective. In keeping with such practices of the prior art, multiple photolithographic masks are routinely used in operations practice after the patterning of the polysilicon gate electrodes merely to create the oppositely doped source/drain regions in self-alignment with the corresponding polysilicon gate electrodes. The processes which did eliminate the multiple masks commonly used lift-off techniques, techniques which are now disfavored by virtue of common negative experiences. Accordingly, there remains a need for a CMOS fabrication process which reduces the number of photolithographic masks, asymmetrically fabricates the p-channel field effect transistors to compensate in part for the higher resistivity of p-type source/drain regions, and asymmetrically forms the n-channel transistors in a configuration which minimizes hot electron trapping effects.

SUMMARY OF THE INVENTION

The present invention defines a process by which CMOS field effect transistors can be fabricated with a reduced number of photolithographic masks, with selectively metalized p-channel transistor source/drain regions, and with selectively defined lightly doped drain structure n-channel transistors. According to the process, selectively deposited metalization is used to mask the source/drain regions of one transistor type while doping the LDD and sidewall oxide spaced source/drain regions of the complementary transistor.

A preferred practice of the present invention begins with the stage of CMOS field effect transistor fabrication at which patterned doped polysilicon gate electrodes are situated at appropriate locations within an active region of a semiconductor substrate and are separated from the substrate by a gate dielectric layer of silicon dioxide. According to the present process, the substrate with associated gate electrodes is thereupon subject to an oxidizing environment. During such oxidation, the heavily doped polysilicon electrodes oxide at nominally ten times the rate the undoped or very lightly doped substrate monocrystalline silicon undergoes oxidation. Thereafter, a photoresist layer is deposited and photolithographically processed to expose the gate electrode and source/drain regions of the p-channel transistor. A p-dopant implant is then accomplished to create self-aligned p-type source/drain regions. Next, an oxide etch is employed to remove the thin oxide layer over the surface of the source/drain region silicon without exposing the polysilicon gate electrode, this attributable to the differentially greater thickness of polysilicon based oxide. The single photoresist mask used in the present process is then stripped.

A selective deposition of refractory metal such as tungsten, or a selective retention of refractory metal silicide follows, with such deposition or retention occurring solely in the regions of exposed silicon corresponding to the p-channel transistor source/drain regions. Such metal or silicide then serves as a mask to succeeding implants.

An LDD dose implant with n-type impurity is then accomplished to form LDD source/drain regions in relative alignment with the n-channel gate electrode, while the p-channel source/drain regions are masked by the metalization. A conformal silicon dioxide deposition and succeeding anisotropic etch of such oxide to the substrate surface produces extended sidewall oxide regions for the n-channel transistor. A heavy dose n-type impurity doping by implant concludes the fabrication cycle, by forming source/drain regions in an electrical continuum to the LDD regions of the n-channel transistor.

Fabrication of CMOS field effect transistors according to the present process minimizes the number of photolithographic masks required, produces a low resistivity shunting metallic region coextensive with the source/drain regions of the p-channel transistor and creates n-channel field effect transistors with integral LDD features. The concluding structure can be readily interconnected using conventional metalization techniques.

BRIEF DESCRIPTION OF THE DRAWINGS

FIGS. 1–10 are schematic cross sections of an active region in a semiconductor substrate at incremental stages of CMOS device fabrication practiced according to the features of the present invention.

DESCRIPTION OF THE PREFERRED EMBODIMENT

Figure 3:
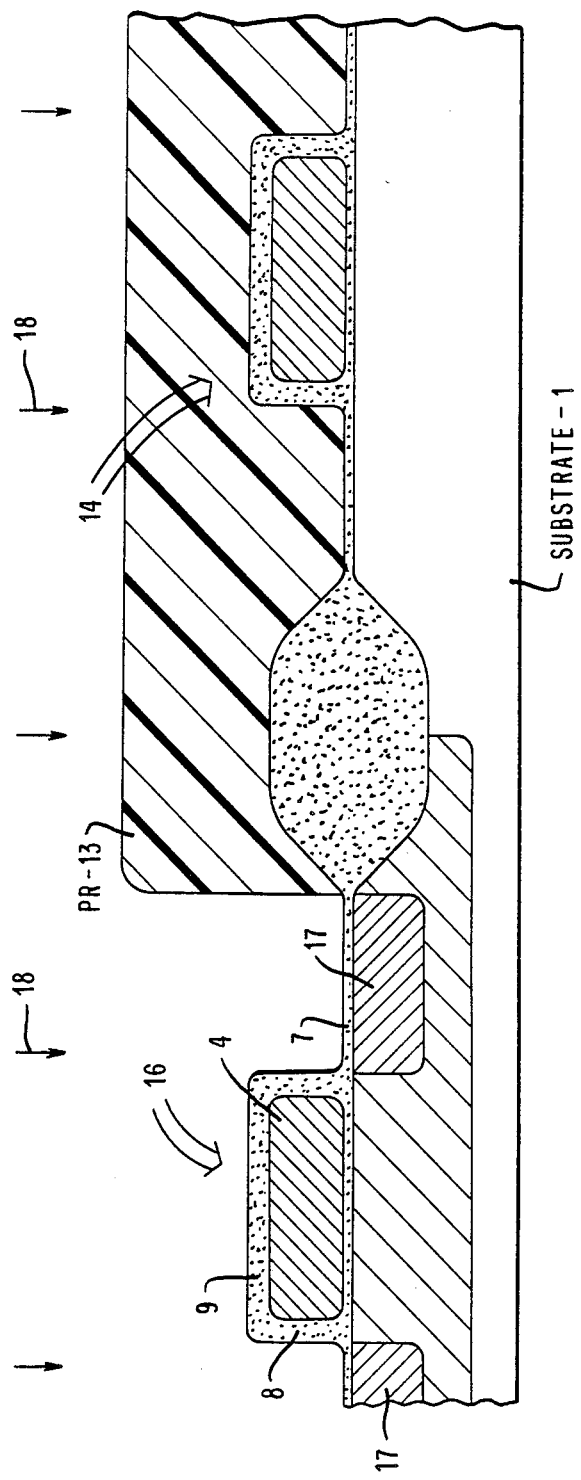

FIG. 1 illustrates by schematic cross section an embodying segment of a monocrystalline silicon substrate or wafer 1 with complementary transistor active regions shown generally at 2 separated by field oxide 10. A lightly doped n-well region 5 is also depicted. The substrate 1 has formed thereupon an oxide gate dielectric layer 3, approximately 17.5 nanometers thick, and individually patterned doped polysilicon gate electrodes 4 and 6, approximately 350 nanometers thick. Such structure represents the starting point for the process of the present invention. The impurity concentrations in polysilicon electrodes 4 and 6 is nominally $10^{21}$ ions per cubic centimeter of phosphorus. Substrate 1 and n-well region 5 are very lightly doped at conventional levels.

As a first step in the preferred practice of the present invention, the substrate is subjected to an oxidation performed in a wet oxygen environment at approximately 950° C. for approximately 75 minutes. The operation is preferably practiced to accentuate the differences in the oxidation rates between the very lightly doped substrate 1/well 5 and the heavily doped polycrystalline silicon electrodes 4/6, so that the thickness of the oxide 7 on the surface of substrate 1 is significantly less than that of oxides 8, 9, 11 and 12 grown onto the side and top surface of polysilicon electrodes 4 and 6. See FIG. 2. For instance, at the conclusion of the oxidation, oxide layer 7 is nominally 10 nanometers thick while oxides 8, 9, 11 and 12 are in the range of 100 nanometers thick. This dramatically different rate of oxidation is attributable to both the impurity concentrations in and the crystalline compositions of the respective materials.

Photoresist 13 is then photolithographically patterned to cover the n-channel field effect transistor 14 gate electrode and source/drain regions while exposing the same for p-channel transistor 16. As shown in FIG. 3, the source/drain regions 17 of n-channel 16 are formed in alignment with gate electrode 4. P-type ions 18 are implanted through thin oxide 7 to form source/drain regions 17 in substrate 1 while photoresist 13 masks the n-channel transistor at 14. Implantation is preferably performed through thin oxide 7 to protect the silicon surface of substrate 1 from implant damage. A representative implantation involves a dose of $5 \times 10^5$ boron ions per square centimeter implanted with an energy of 30K electrons volts.

The cross section illustrated in FIG. 4 shows the p-channel transistor 16 following etch of oxide 7, preferably an anisotropic etch, to expose the surface of the silicon substrate 1 in the source/drain regions 17 while retaining, as a consequence of the thicker layer, a residual silicon dioxide layer 18 over gate electrode 4 and sidewall oxide 8 on either side of gate electrode 4. Layer 18 should be at least 10 nanometers thick. Given the relative thicknesses of layers 7 and 9 (FIG. 3), the concluding thickness of layer 18 provides significant margin to moderate over-etch and preclean operations directed to the silicon surfaces at source/drain regions 17. The preferred use of an anisotropic etch retains the sidewall oxide layers 8 substantially intact, to ensure complete electrical separation between gate electrode 4 and source/drain regions 17 following metalization. An alternative practice of the etching operation would involve the use of a classic wet etch to remove all exposed oxide at a proportional rate. The wet etch is preferred where source/drain region surface damage must be minimized.

Another practice of the invention in the context of the anisotropic oxide etch concluding with the structure in FIG. 4 would involve a continuation of the etch until oxide 18 is completely removed and the upper surface of polysilicon gate electrode 4 is exposed. This is a less desirable practice of the invention in that limited oxide-to-silicon selectivity of available anisotropic etch processes will produce measurable silicon surface erosion in source/drain regions 17, recessing the levels thereof. This practice would expose the surface of gate electrode 4 for selective deposition of metal or silicide formation.

FIG. 5 shows the structure of the substrate following the strip of photoresist mask 13. Note, in particular, that according to the preferred practice of the invention gate electrode 4 of p-channel field effect transistor 16 as well as gate electrode 6 of n-channel field effect transistor 14 are fully enclosed within silicon dioxide, and further that the silicon surfaces of source/drain regions 17 of p-channel transistor 16 are exposed while the corresponding, yet to be formed, source/drain regions of the n-channel transistor 14 remain covered by silicon dioxide layer 7. FIG. 5 also portrays that the structure is relatively smooth and devoid of joints or cavities which might trap contaminates during the extensive cleaning commonly required to prepare for a selective deposition or formation of metalization.

Figure 6:
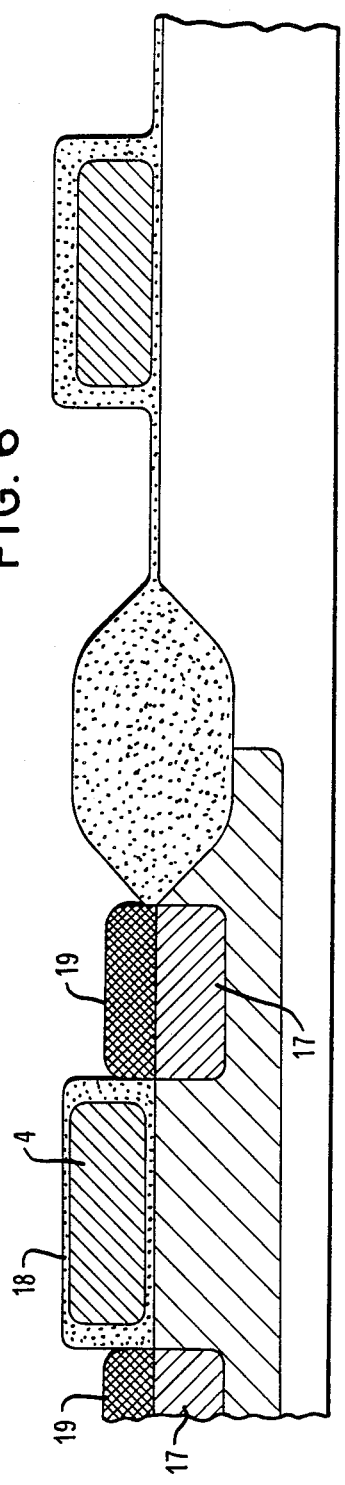

Selective deposition of a refractory metal follows, producing the structure illustrated in FIG. 6. Although selective deposition of tungsten is the preferred operation to form metalization 19 onto the exposed silicon of source/drain regions 17, it remains possible to substitute other refractory metal or silicide formation practices. The use of commercially available selective tungsten deposition equipment ensures that metal 19 forms only onto surfaces having exposed silicon. Stated in the alternative, the surfaces of silicon dioxide, or silicon nitride where applicable, do not provide nucleation sites for metal formation during such selective deposition. Note that if one alternate practice of the present invention were implemented, where oxide 18 is absent from the top surface of gate electrode 4, a selective deposition of metal would also occur on the top surface of polysilicon gate electrode 4. The illustrated practice of the invention is preferred in that the risk of a metal bridging between the metal overlying gate electrode 4 and metal 19 deposited onto source/drain regions 17 is eliminated. The concepts set forth above are fully applicable to refractory metals other than tungsten.

Metalization 19 can also be selectively formed over source/drain regions 17 as a silicide of refractory metals such as titanium, cobalt, platinum, tungsten, or tantalum. According to this practice of the invention, the base metal is blanket deposited onto the structure depicted in FIG. 5 and then subjected to a thermal environment suitable to react such metal with the exposed silicon, forming a metallic silicide. A selective etch which removes the metal but not the silicide follows. An undesirable aspect of this method for forming the metalization 19, in contrast to the selective deposition of a refractory metal, is the stress introduced by the volumetric expansion of metalization 19 in the course of silicide compound formation.

Figure 7:
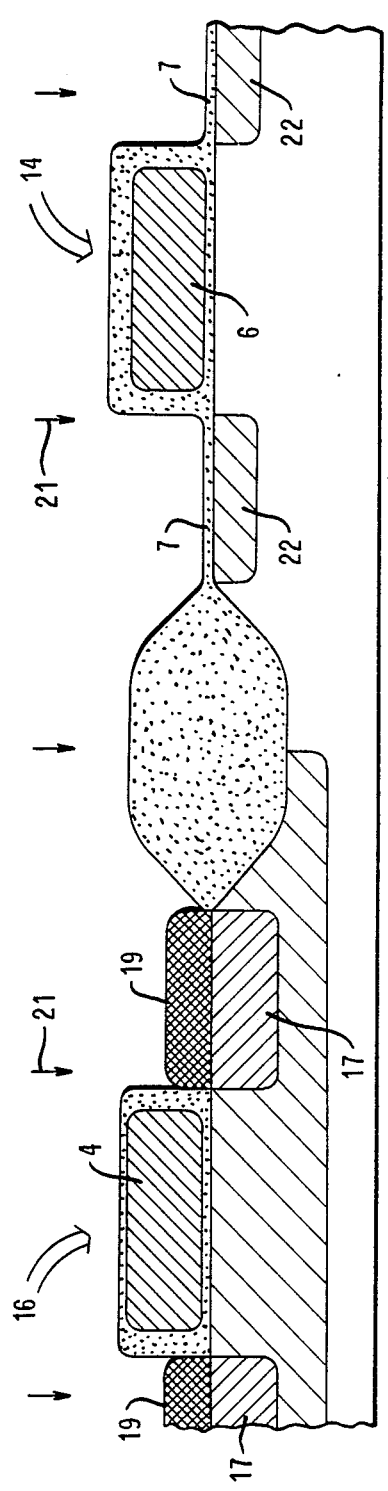

FIG. 7 illustrates the next stage in the preferred fabrication sequence. As shown, a low dose implant 21 of n-type dopant is undertaken to form lightly doped n-type regions 22 self-aligned to gate electrode 6 of n-channel field effect transistor 14. A preferable practice involves a dose of $5 \times 10^{13}$ ions per square centimeter of phosphorus implanted with an energy of 40K electron volts to form LDD regions 22. Metalization 19 masks the source/drain regions 17 of p-channel transistor 16 from the counter-doping effects which would otherwise be produced by implant 21. Again, thin oxide layer 7 prevent damage to the silicon surface. Since polysilicon gate electrodes 4 and 6 are commonly very heavily doped from the onset, implant 21, as well as previously practiced p-type implant 18 (FIG. 3) have negligible effect on the gate electrode conductivity.

The structure depicted in FIG. 8 is obtained by conformally depositing a layer 23 of silicon dioxide onto the structure shown in FIG. 7. The absence of severe topological excursions facilitates the conformal deposition of the oxide without reentry problems and with commercially available fabrication equipment. The thickness of deposit oxide 23 is nominally 250 nanometers.

An anisotropic etch of oxide follows and is continued until the surface of polysilicon gate electrodes 4 and 6, metalization 19, and LDD source/drain regions 22 are exposed. A representative anisotropic etch which is relatively selective in removing oxide at a rate significantly greater than polysilicon, monocrystalline silicon, or tungsten refractory metal involves the use $CHF_3:O_2$ etchant in a reactive ion etching chamber. At the conclusion of this etch, sidewall oxide layers or spacers are retained adjacent each vertical wall of the structure last illustrated in FIG. 7. For example, there are shown in FIG. 9 oxide residuals 24 adjacent gate electrode 4, sidewall oxide residuals 26 adjacent metalization 19/field oxide 10 and, most importantly, sidewall oxide residuals 27 on either side of gate electrode 6 of n-channel transistor 14.

Figure 10:
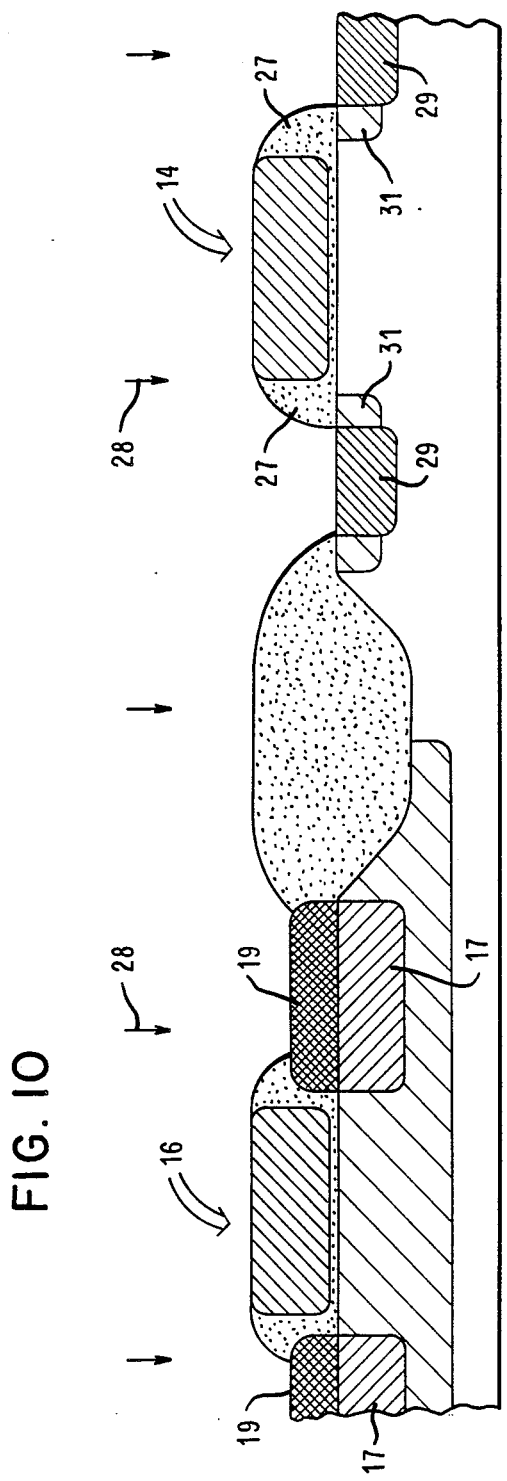

Fabrication according to the unique sequence defined by the present invention concludes, as shown in FIG. 10, with a heavy dose source/drain implant 28 to form the heavily doped n-type source/drain regions 29 of n-channel field effect transistor 14. Again, metalization 19 serves as a mask to prevent any counter-doping of the p-channel transistor source/drain regions 17. As illustrated, implant masking by sidewall oxides 27 produces lightly doped drain regions 31 for n-channel transistor 14. A representative implant 28 involves the use of arsenic at a dose of $6 \times 10^{15}$ ions per square centimeter and at an energy of 75K electrons volts.

Fabrication of the CMOS integrated circuit is concluded in relatively conventional manner, including first an anneal sequence to activate and slightly diffuse, into further alignment with the gate electrodes, the various implanted source/drain dopants. Dielectric depositions, contact/via etchings, and metalizations to electrically interconnect the electrical nodes of the p-channel transistor 16 and n-channel transistor 14 are performed in known manners.

In reflecting upon the present process and its concluded structure, recall that p and n-channel field effect transistors were differentiated during formation using a single photolithographic mask. Furthermore, note that the concluding structure exhibits features refined to compensate for the individual idiosyncrosies of the two transistor types. For example, the lower mobility of the p-type doped source/drain regions is offset by the coextensive presence of refractory metal or silicide metalization 19. Consequently, the source/drain region resistences of p-channel transistor 16 do not materially contribute to the transistor's transconductance characteristics. At the same time, the susceptibility of n-channel field effect transistors to hot electron trapping effects is mitigated by the integration of LDD source/drain regions into the conventional heavily doped source/drain region structures. The present process thereby produces CMOS transistors having structural asymmetry particularly suited to the needs and capabilities of both p-channel and n-channel field effect transistors.

It will be understood by those skilled in the art that the embodiments set forth hereinbefore are merely exemplary of the various elements and procedures which are essential to the present invention, and as such, may be replaced by equivalents without departing from the invention, which now will be defined by appended claims.

I claim:

1. A process for forming CMOS field effect transistor integrated circuits, comprising the steps of:
    forming in an active region of a semiconductor substrate first and second polysilicon gate electrodes with underlying gate dielectrics;
    forming a capping dielectric layer over the first and second polysilicon gate electrodes;
    forming a photolithographic mask over the second polysilicon gate electrode and associated field effect transistor source/drain regions;
    doping the substrate in the presence of the photolithographic mask to form source/drain regions in the semiconductor substrate aligned to the first polysilicon gate electrode;
    selectively forming metallic regions over the source/drain regions of the first polysilicon gate electrode;
    thereafter lightly doping source/drain regions of the second polysilicon gate electrode in alignment with the second polysilicon gate electrode using said metallic regions as a mask;
    forming a sidewall dielectric for the second polysilicon gate electrode; and
    heavily doping the source/drain region of the second polysilicon gate electrode in alignment with the sidewall dielectric.

2. The process recited in claim 1, wherein the forming of a capping dielectric layer involves an oxide growth characterized by a differential oxidation rate between the silicon substrate and the gate electrode polysilicon, and the further step of removing grown silicon dioxide from source/drain regions aligned to the first polysilicon gate electrode before removing the photolithographic mask.

3. The process recited in claim 2, wherein a capping layer of silicon dioxide is retained over the first polysilicon gate electrode following the removal of the grown silicon dioxide from the source/drain regions aligned to the first polysilicon gate electrode.

4. The process recited in claim 3, wherein the selective formation of metallic regions involves a selective deposition of a refractory metal.

5. The process recited in claim 3, wherein the selective formation of metallic regions involves the steps of:
    blanket depositing a metal layer;
    conditioning the substrate to selectively react the deposited metal with substrate silicon in the source/drain regions; and
    selectively removing unreacted metal.

6. The process recited in claim 4, wherein the sidewall dielectric for the second polysilicon gate electrode is formed by:
    conformally depositing silicon dioxide; and
    anisotropically etching the silicon dioxide to expose the source/drain region.

7. The process recited in claim 5, wherein the sidewall dielectric for the second polysilicon gate electrode is formed by:
   conformally depositing silicon dioxide; and
   anisotropically etching the silicon dioxide to expose the source/drain region.

8. The process recited in claim 6, wherein the first polysilicon gate electrode defines a p-channel field effect transistor and the second polysilicon gate electrode defines an n-channel field effect transistor.

9. The process recited in claim 7, wherein the first polysilicon gate electrode defines a p-channel field effect transistor and the second polysilicon gate electrode defines an n-channel field effect transistor.

10. The process recited in claim 8, wherein the light doping of the source/drain region in alignment with the second polysilicon gate uses n-type impurity to form an LDD region aligned to the second polysilicon gate electrode.

11. The process recited in claim 9, wherein the light doping of the source/drain region in alignment with the second polysilicon gate uses n-type impurity to form an LDD region aligned to the second polysilicon gate electrode.

* * * * *